United States Patent [19]
Lampman et al.

[11] Patent Number: 4,928,063
[45] Date of Patent: May 22, 1990

[54] AUTOMATIC EDDY CURRENT CORRECTION

[75] Inventors: David A. Lampman, Lakewood; Michael A Morich, Richmond Hts.; Wayne R. Dannels, Willoughby, all of Ohio

[73] Assignee: Picker International, Inc., Highland Hts., Ohio

[21] Appl. No.: 349,868

[22] Filed: May 10, 1989

Related U.S. Application Data

[63] Continuation-in-part of Ser. No. 118,865, Nov. 9, 1987, abandoned.

[51] Int. Cl.$^5$ ............................................. G01R 33/20
[52] U.S. Cl. ..................................... 324/307; 324/320
[58] Field of Search ............... 324/307, 309, 312, 313, 324/314, 318, 322, 202, 320; 364/413.13

[56] References Cited

U.S. PATENT DOCUMENTS

| | | | |
|---|---|---|---|
| 3,792,345 | 2/1974 | Hawkins | 324/5 R |
| 4,005,358 | 1/1977 | Foner | 324/34 R |
| 4,081,742 | 3/1978 | Hofer et al. | 324/307 |
| 4,300,096 | 11/1981 | Harrison et al. | 324/309 |
| 4,486,318 | 5/1983 | Burbank et al. | 324/244 |
| 4,585,995 | 4/1986 | Flugan | 324/322 |
| 4,623,844 | 11/1986 | Macovski | 324/320 |
| 4,698,591 | 10/1987 | Glover et al. | 324/318 |
| 4,700,138 | 10/1987 | Shimazaki et al. | 324/322 |
| 4,743,851 | 5/1988 | Lim et al. | 324/309 |
| 4,761,612 | 8/1988 | Holland et al. | 324/307 |
| 4,761,614 | 8/1988 | Pramer et al. | 324/320 |
| 4,812,797 | 3/1989 | Jayakumar | 324/320 |

OTHER PUBLICATIONS

"Noise Pulse Generator for Nuclear Magnetic Resonance (NMR) Measurements of Self Diffusion According to the Pulsed Gradient Method" by Skirda, et al., Instruments and Experimental Techniques, vol. 19, No. 3, pp. 750–752, May–Jun., 1976.

Primary Examiner—Hezron E. Williams
Assistant Examiner—Kevin D. O'Shea
Attorney, Agent, or Firm—Fay, Sharpe, Beall, Fagan, Minnich & McKee

[57] ABSTRACT

A gradient field controller (30) generates current pulses with a preselected profile. Eddy current compensation circuits (42) alter the current pulse profile by adding additional components of selectable frequencies with selectable amplitudes or gains. A power amplifier (32) amplifies the modified current pulse and applies them to gradient field coils (34) of a magnetic resonance imager. A probe or coil (50) monitors the induced gradient response which is integrated (52) to provide an electronic representation of the induced gradient profile. A least squares analysis routine (72) determines the time constant and amplitude of a component attributable to a first eddy current which degrades the induced gradient profile. A filter frequency correction factor calculating routine (76) calculates appropriate filter frequency settings and a gain calibration factor calculating routine (78) calculates the gain settings for the compensation circuits (42). In operation, a repetitive correction sequence is implemented in which a current pulse is applied, the induced gradient field monitored, the longest time constant and the corresponding amplitude are determined, and appropriate adjustments to the calibration circuits are determined. The correction sequence is repeated, each time monitoring a shorter time constant eddy current until the profile of the induced gradient substantially conforms to a preselected profile 23 Claims, 2 Drawing Sheets

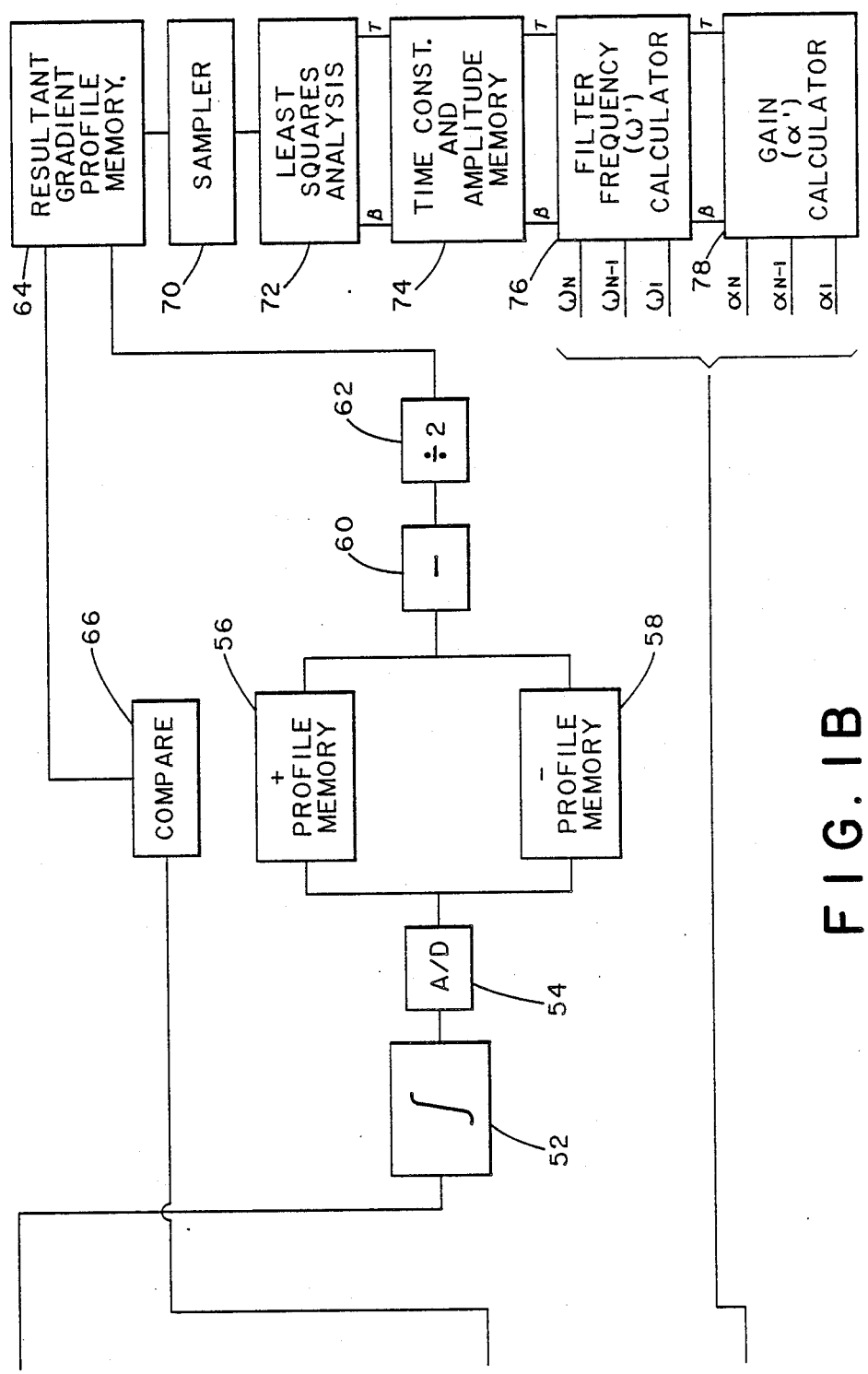
FIG. IB

AUTOMATIC EDDY CURRENT CORRECTION

This is a continuation-in-part of U.S. application Ser. No. 118,865, filed on Nov. 9, 1987, now abandoned.

BACKGROUND OF THE INVENTION

The present invention relates to the art of electromagnetic field correction and modification. It finds particular application in conjunction with establishing temporal dependence of magnetic field gradients in magnetic resonance imaging and will be described with particular reference thereto. It is to be appreciated, however, that the invention will also find application in conjunction with magnetic resonance spectroscopy and other applications in which eddy currents degrade electromagnetic field temporal dependence.

In magnetic resonance imaging and spectroscopy, a uniform magnetic field is created through an examination region in which a subject to be examined is disposed. The magnetization vector of dipoles in the examined subject preferentially aligns with the uniform field. Radio frequency excitation pulses are supplied to cause the magnetization vectors to precess about the uniform field. After the radio frequency excitation, the precessing magnetization vectors generate radio frequency magnetic resonance signals as the precession decays back toward alignment with the uniform magnetic field. The frequency of the radio frequency resonance signals is proportional to the strength of the magnetic field. Various combinations of radio frequency pulses and magnetic field gradient pulses are applied to manipulate the precessing magnetization vector to create magnetic resonance signals, such as echo signals.

In magnetic resonance imaging, gradient magnetic fields are applied to select and encode the magnetic resonance signals. The magnetic field gradients are applied to select one or more slices or planes to be imaged. Further gradient fields are applied for selectively modifying the uniform magnetic field to encode frequency and phase into the magnetization vectors, hence, the resonance signals, which identify spatial location within the selected plane.

The gradient fields are conventionally applied as a series of gradient pulses. Specifically, electrical current pulses are applied to gradient field magnets adjacent the image region. A profile, or particular temporal dependence, is selected for the current pulse in accordance with the profile of the gradient magnetic field to be applied, commonly a square wave or step function, a trapezoid, or other ideal wave shapes.

One of the inherent problems is that the profile of the gradient magnetic field pulse does not match the profile of the electrical current pulse. A changing magnetic field induces eddy currents in adjacent electrically conductive structures. Each eddy current causes a corresponding eddy magnetic field. Thus, the resultant gradient pulse causes eddy currents that add unwanted eddy components to the induced gradient pulse. The effect of the eddy current varies with the amount and conductivity of the material in which the eddy current is induced, the proximity of the material to the gradient coil, and the magnitude of the pulsed gradient magnetic field. The metallic structures might include supporting structures of the magnet, a room temperature bore tube, a liquid nitrogen dewar for superconducting magnets, other gradient field coils, and the like. Construction tolerances cause the eddy current response to vary from unit to unit.

In order to improve image quality, the shape of the electric current pulses is altered such that the magnetic field produced by the sum of the current pulse and the corresponding eddy currents approximates the desired gradient magnetic field profile. Commonly, the current pulse correction circuit includes a plurality of filters whose characteristic frequency is adjustable. An amplifier with an adjustable gain is associated with each filter. Typically, a large array of potentiometers is provided for adjusting the characteristic filter frequencies and the gain corresponding to each. In this manner, selected frequency components of the current pulse are enhanced or suppressed as may be necessary such that the gradient magnetic field produced by the sum of the current pulse and the induced eddy currents has a substantially preselected profile.

Manual calibration, which is very difficult and time consuming, is commonly achieved by trial and error. The time for performing the calibration may vary widely with the skill and luck of the calibrating technician. Although some guidance might be obtained from units of the same model, manufacturing tolerances provide a sufficiently wide variation in resultant eddy currents that a unique calibration is required for every unit.

Another drawback to manually adjusted systems is that the calibration is frequently not optimized. The eddy current compensation components are frequently interrelated. Adjusting the frequency of one of the filters or its corresponding gain commonly alters the response of the other eddy currents as well. Thus, a small change to improve the response at one frequency may cause significant error at others. The calibration process is often terminated when the magnetic field response is brought within predefined specifications, rather than when the calibration is optimized.

The present invention provides a new and improved automatic calibration method and apparatus which overcomes the above referenced drawbacks and others.

SUMMARY OF THE INVENTION

In accordance with one aspect of the present invention, a method of automatic calibration is provided. After a magnetic field is created through an examination region, a current pulse is applied to a gradient field coil to create a gradient of a preselected profile across the magnetic field. However, due to the induced eddy currents, the resultant gradient does not have the preselected profile. The created gradient is monitored and analyzed to determine the time constant of a first degrading eddy current contribution and the amplitude thereof. Correction factors for correcting the current pulse for the first eddy current are determined. Another current pulse altered in accordance with the determined correction factors is applied to the gradient field coil and the resultant magnetic field gradient is monitored. The monitored gradient is analyzed to determine a time constant and amplitude of a second eddy current. New correction factors are determined for the current pulse in accordance with the first and second time constants and amplitudes.

In accordance with a further aspect of the present invention, a third current pulse with the second determined correction factors is applied to the gradient field coil. The resultant magnetic field gradient is monitored and its profile compared to the preselected profile. If the two profiles do not match to within selected tolerances, the monitored gradient is analyzed to determine a third time constant and amplitude corresponding to a third eddy current. The correction factors for the current pulse are recalculated.

This current correction factor recalibration process is conducted starting with the longest time constant eddy current and stepping through progressively shorter time constant eddy currents until the profile of the resultant magnetic field gradient substantially matches the preselected profile.

In accordance with another aspect of the present invention, an apparatus for performing the above referenced calibration method is provided.

One advantage of the present invention is that it reduces the labor intensity of gradient magnetic field profile calibration.

Another advantage of the present invention is that it is amenable to automatic, machine implemented calibration of gradient magnetic field profiles.

Still another advantage of the present invention is that it improves the precision and accuracy of gradient magnetic field profile calibration.

Still further advantages of the present invention will become apparent to those of ordinary skill in the art upon reading and understanding the following detailed description of the preferred embodiment.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting the invention.

FIG. 1A and 1B are two parts of a diagrammatic illustration of a magnetic resonance imaging apparatus in accordance with the present invention.

DETAILED DESCRIPTION OF THE PREFERRED EMBODIMENT

Figure 1A:
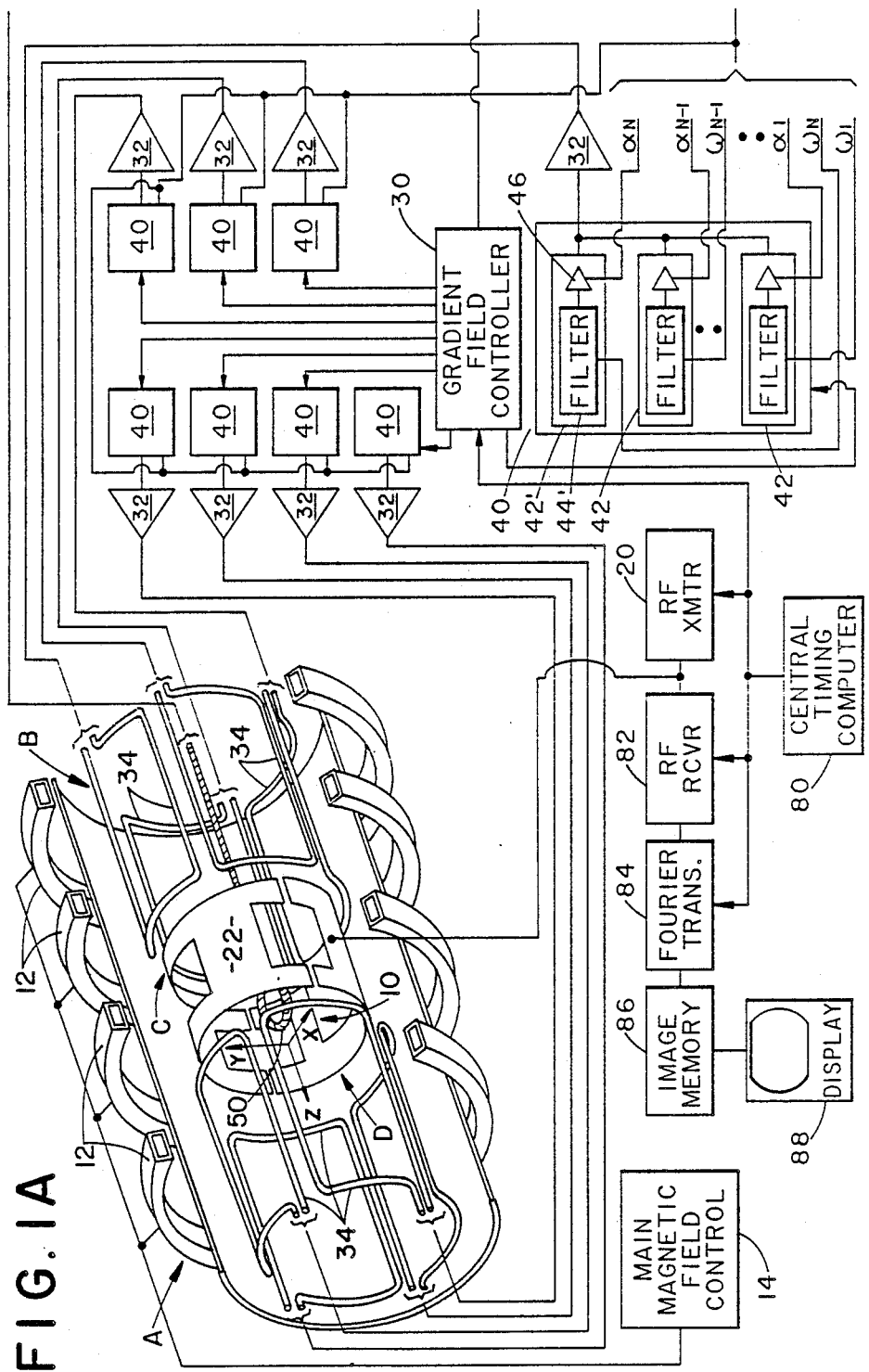

With reference to the FIGS. 1A and 1B, a magnetic resonance imaging apparatus includes a main magnetic field means A for generating a substantially uniform magnetic field longitudinally through an examination or image region 10. The main magnetic field means includes a plurality of main field magnets 12 which are operated under the control of a main magnetic field control means and power supply 14. Various electrical and mechanical shimming techniques are provided for rendering the resultant main magnetic field linear and uniform through the image region after correction for any distortion caused by surrounding imager hardware.

A resonance excitation means C includes a radio frequency transmitter 20 for generating a magnetic resonance excitation pulse and other magnetic resonance manipulation pulses. A radio frequency antenna 22 is disposed adjacent the image region for transmitting radio frequency pulses into a patient or other subject in the image region.

A gradient field means B selectively creates gradient magnetic fields across the main magnetic field in the image region 10. A gradient energization profile generating means 30 selectively generates gradient field energizing current pulses with preselected profiles including timing and duration relative to the radio frequency pulses. Commonly, the gradient profiles include slice select gradient profile for selecting a slice or planar region to be imaged. A read gradient pulse or profile provides frequency encoding along a preselected read axis lying within the selected slice. With each repetition of the sequence, a phase encode gradient pulse or profile of a different amplitude provides a phase encoding along a phase encode axis, generally perpendicular to the read axis.

A gradient power amplifier 32 amplifies the current pulse profiles from the gradient field controller 30 to an appropriate driving amplitude. The gradient energizing profiles, commonly current pulses, are applied to a gradient coil means 34 which includes a plurality of gradient coils for causing gradients along each of three mutually perpendicular axes. Preferably, the coils are symmetric about three mutually perpendicular planes. The gradient coils convert the current pulses or profiles into corresponding gradient magnetic field pulses with corresponding profiles. However, changing magnetic fields induce eddy currents in the surrounding metal structures including the gradient coils themselves. These eddy currents generate magnetic field components that oppose the gradient magnetic field profiles but decay with time causing a distortion in the gradient magnetic field profiles. In this manner, the eddy currents cause the gradient magnetic field profile to differ from a preselected profile.

A gradient profile compensation or adjustment means 40 alters the gradient energization current profiles to compensate for eddy currents. A plurality of parallel connected filter or compensation circuits 42 are connected with each gradient power amplifier 32. The altered gradient energizing current pulse or profile and the induced eddy currents together create a resultant magnetic field having the preselected profile. More specifically, the gradient profile generating means 30 generates a current pulse having substantially the preselected profile, e.g. a step function profile. The eddy current compensation means 40 produces an altered current pulse profile which compensates for the eddy currents and the like. In this manner, the preselected profile and the resultant gradient magnetic field profile are substantially the same.

The like compensation circuits 42 each include an adjustable filter 44 whose characteristic frequency is digitally adjustable and an amplifier 46 whose gain is digitally adjustable. The plurality of parallel interconnected compensation circuits enable a like plurality of frequency components to be selected and emphasized. The selected frequency is related to an inverse of the time constant of a corresponding degrading eddy current and the gain is simply related to the amplitude of that eddy current. With a plurality of calibration circuits, compensation can be made for a plurality of eddy currents. However, as explained below, the eddy current time constants and amplitudes are interrelated. The compensation circuit filter frequency and gain are not directly proportional to the inverse of the time constant and amplitude for one of the eddy currents. A suitable digital calibration circuit is illustrated in co-pending U.S. Pat. application Ser. No. 033,532, filed Apr. 3, 1987, now U.S. Pat. No. 4,761,612, which issued Aug. 2, 1988, the disclosure of which is incorporated herein by reference.

A gradient field sensing means, such as a search coil 50 and an integrating means 52 are used to monitor the resultant magnetic field gradients. An analog to digital converter 54 digitizes the monitored gradient magnetic field profile and stores it in a first polarity profile memory means 56. A base line correction means corrects the resultant gradient profile for any baseline errors. In the preferred embodiment, the baseline correction means causes a like magnetic field gradient with the opposite polarity to be applied. The resultant magnetic field profile is digitized, and stored in a second or opposite polarity profile memory means 58. The equal but opposite polarity gradient magnetic fields are subtracted by a subtraction means 60 and divided by two by a dividing means 62 to produce a baseline corrected profile. The resultant baseline corrected resultant gradient profile is stored in a resultant gradient profile memory means 64. By generating two opposite polarity but otherwise equal gradient magnetic field profiles and taking their difference, the affects of any DC bias are removed. A comparing means 66 compares the resultant gradient profile to determine conformity therebetween.

A sampling means 70 samples the profile at selectable, discrete intervals. The sampling means samples the profile at a selectable time from its commencement, e.g. 180 ms. Samples are taken at regular intervals, e.g. 60 ms, thereafter. The commencement interval and inter-sampling intervals are selected in accordance with the time constant of a monitored eddy current. For higher frequency, shorter time constant eddy currents, the intervals may be shortened to emphasize the response at the beginning of the gradient. For low frequency, long time constant eddy currents, the intervals may be extended. Sampling only near the end of the gradient reduces high frequency, short time constant eddy contribution to the samples. An analysis means 72, such as a least squares analysis program, analyses the sampled profile data to determine a time constant and amplitude of a degrading eddy magnetic field component. A time constant and amplitude memory means 74 stores the time constant and amplitude for a plurality of analyzed eddy currents. A filter frequency means 76 determines the filter frequencies for each of the compensation circuits from the stored time constants and amplitudes. In the preferred embodiment, the filter frequencies are determined by calculating the roots of a polynomial equation, whose coefficients are calculated from the time constants and amplitudes is retrieved from the time constant and amplitude memory means 74. The number of filter frequencies roots determined coincides with the number of stored time constants. A gain calculating means 78 calculates the gain for each compensation circuit from the amplitudes and at least one of the time constants and the filter frequencies. In the preferred embodiment, the gain calculating means inverts a matrix whose elements are calculated from the data from the time constants or frequencies and the amplitudes.

In operation, a pair of like gradient pulses with opposite polarity are applied, digitized, baseline corrected, and stored in the resultant gradient profile memory means 64. The eddy component with the longest detectable time constant is identified and its time constant and amplitude determined by the least squares analysis means 72. The filter frequency means 76 converts the determined time constant and amplitude to a first filter frequency setting or correction factor for one of the compensation circuits. The gain calculating means converts the first amplitude into a first gain setting or correction factor. Like gradient pulses with the first determined compensation factors are applied, digitized, baseline corrected, and stored in the resultant gradient profile memory means 64. The analyzing means 72 identifies the eddy component with the next longest time constant and identifies its time constant and amplitude. The filter frequency means 76 recalculates the first filter frequency and a second filter frequency. The gain calculating means recalculates the first and second gain settings or correction factors.

The routine is repeated with the current pulse modified by the second correction factors and a third resultant gradient profile is determined and stored in the profile memory means 64. If the comparing means 66 determines whether the resultant gradient profile is sufficiently close to the preselected profile, the comparing means may compare the profile of the resultant gradient magnetic field with the profile of the current pulse. When the gradient magnetic field profiles are step functions, i.e. have a flat surface, the comparing means may determine the degree of flatness of the resultant profile. If the resultant gradient magnetic field profile is not a sufficiently close match to the preselected profile, the analysis means 72 identifies the eddy component with the third to longest time constant and determines its time constant and amplitude. The filter frequency and gain calculation means calculate three frequency settings and three gains from the three time constants and amplitudes stored in the memory 74. This process is repeated each time with the next longest eddy current component until the resultant gradient magnetic field profile and the preselected profile match to within acceptable limits or tolerances.

Looking now to polynomial equation and matrix of the preferred embodiment, the total field gradient response to a step current pulse can be represented or modeled as a linear sum of exponentially decaying components:

$$g_o(t) = \left(1 - \sum_{i=1}^{N} \beta_i e^{-t/\tau_i}\right) u(t), \quad (1)$$

where $g_o(t)$ is the normalized step response, N is the number of eddy current components, $\beta_i$ is the amplitude of the ith eddy current component, and $\tau_i$ is the time constant of the ith eddy current component, and $u(t)$ is the usual Heaviside step function. An eddy current transfer function $H_e(s)$ can be determined based on the fact that $g_o(t)$ results from a step input, $$H_e(s) = 1 - \sum_{i=1}^{N} \frac{\beta_i s}{s + \omega_i}, \quad (2)$$

where $\omega_i = 1/\tau_i$ in the frequency domain. Exact compensation for the eddy current effect is achieved by filtering the applied input with a filter function transfer function $H_f(s)$ which is the inverse of the eddy current transfer function. That is, $$H_f(s) = (H_e(s))^{-1} = \frac{1}{1 - \sum_{i=1}^{N} \frac{\beta_i s}{s + \omega_i}} = 1 + \sum_{i=1}^{N} \frac{\alpha_i s}{s + \omega_i'}, \quad (3)$$

where $\alpha_i$ and $\omega_i'$ are the sought after fractional gains and characteristic angular frequencies of the compensating filter network 42. When the filter and inverse eddy current transfer functions are equal, then the sought after condition of the input and output being the same has been achieved.

For a single term correction, i.e. for N=1, Equation (3) is readily solved for $\alpha_i$ and $\omega_i'$, i.e.

$$\alpha_1 = \frac{\beta_2}{1-\beta_1} \quad (4a)$$

$$\omega_1' = \frac{\omega_1}{1-\beta_1} \quad (4b)$$

by replacing $\omega_i$ with $\omega_i'$ and by replacing $\beta_i$ with $-\alpha_i$. The $\omega_i'$ are the N roots of the polynomial equation $$b_4\omega^{14} - b_3\omega^{13} + b_2\omega^{12} - b_1\omega^1 + b_0 = 0 \quad (7)$$

The fractional gains $\alpha_i$ satisfy the linear system:

$$\begin{bmatrix} 1 & 1 & 1 & 1 \\ \omega_2'+\omega_3'+\omega_4' & \omega_1'+\omega_3'+\omega_4' & \omega_1'+\omega_2'+\omega_4' & \omega_1'+\omega_2'+\omega_3' \\ \omega_2'\omega_3'+\omega_2'\omega_4'+\omega_3'\omega_4' & \omega_1'\omega_3'+\omega_1'\omega_4'+\omega_3'\omega_4' & \omega_1'\omega_2'+\omega_1'\omega_4'+\omega_2'\omega_4' & \omega_1'\omega_2'+\omega_1'\omega_3'+\omega_2'\omega_3' \\ \omega_2'\omega_3'\omega_4' & \omega_1'\omega_2'\omega_4' & \omega_1'\omega_2'\omega_4' & \omega_1'\omega_2'\omega_3' \end{bmatrix} \begin{bmatrix} \alpha_1 \\ \alpha_2 \\ \alpha_3 \\ \alpha_4 \end{bmatrix} = \begin{bmatrix} \frac{1-b_4}{b_4} \\ \frac{a_3-b_3}{b_4} \\ \frac{a_2-b_2}{b_4} \\ \frac{a_1-b_1}{b_4} \end{bmatrix}$$

That is, $[\omega][\alpha] = [c]$ where $0 \leq \beta_i < 1$ and the resultant frequencies are well separated, e.g. separated by a decade or more For higher orders of N, a relatively simple pattern occurs which results in 2N equations. Although the results can be extended to most any value of N, in practice solving Equation (3) for N=4 normally produces satisfactory, correspondence between the resultant gradient profile and the preselected profile. For N=4, Equation (3) can be written as:

$$\left(\frac{1}{b_4}\right) \frac{s^4 + a_3s^3 + a_2s^2 + a_1s + a_0}{s^4 + \frac{b_3}{b_4}s^3 + \frac{b_2}{b_4}s^2 + \frac{b_1}{b_4}s + \frac{b_0}{b_4}} = \quad (5)$$

$$(a_4') \frac{s^4 + \frac{a_3'}{a_4'}s^3 + \frac{a_2'}{a_4'}s^2 + \frac{a_1'}{a_4'}s + \frac{a_0'}{a_4'}}{s^4 + b_3's^3 + b_2's^2 + b_1's + b_0'}$$

which can be solved by equating coefficients, i.e.

$$a_o = \omega_1\omega_2\omega_3\omega_4 \quad (6a)$$

$$a_1 = \omega_1\omega_2\omega_3 + \omega_1\omega_3\omega_4 + \omega_1\omega_2\omega_4 + \omega_2\omega_3\omega_4 \quad (6b)$$

$$a_2 = \omega_1\omega_2 + \omega_1\omega_3 + \omega_1\omega_4 + \omega_2\omega_3 + \omega_2\omega_4 + \omega_3\omega_4 \quad (6c)$$

$$a_3 = \omega_1 + \omega_2 + \omega_3\omega_4 \quad (6d)$$

$$a_4 = 1 \quad (6e)$$

$$b_0 = a_0 = \omega_1\omega_2\omega_3\omega_4 \quad (6f)$$

$$b_1 = (1-\beta_1)\omega_2\omega_3\omega_4 + (1-\alpha_2)\omega_1\omega_3\omega_4 + (1-\alpha_3)\omega_1\omega_2\omega_4 + (1-\beta_4)\omega_1\omega_2\omega_3 \quad (6g)$$

$$b_2 = (1-\beta_1-\beta_2)\omega_3\omega_4 + (1-\beta_1-\beta_3)\omega_2\omega_4 + (1-\beta_1-\beta_4)\omega_2\omega_3 \\ + (1-\beta_2-\beta_3)\omega_1\omega_4 + (1-\beta_2-\beta_4)\omega_1\omega_3 + (1-\beta_3-\beta_4)\omega_1\omega_2 \quad (6h)$$

$$b_3 = (1-\beta_1-\beta_2-\beta_3)\omega_4 + (1-\beta_1-\beta_2-\beta_4)\omega_3 + (1-\beta_1-\beta_3\beta_4)\omega_2 + (1-\beta_2-\beta_3-\beta_4)\omega_1 \quad (6i)$$

$$b_4 = 1 - \beta_1 - \beta_2 - \beta_3 - \beta_4 \quad (6j)$$

The $a'_k$ components can be retrieved from $b_k$ components by replacing $\omega_i$ with $\omega_i'$ and $\beta_i$ with $-\alpha_i$. The $b'_k$ components can be retrieved from the $a_k$ components Solving for the generalized condition, the polynomial coefficients $b_k$ ($k=0, 1, \ldots N$) and the column vector $[c]$ are calculated from the measured input parameters $\beta_i$ and $\tau_i$. The polynomial of Equation (8) is solved for the roots $\omega_i'$ and the matrix $[\omega]$ is inverted to obtain the $\alpha_i$. There are convenient algebraic and physical properties which simplify the numerical procedure for arbitrary orders of N.

The formulae for the $a_i$ ($l=0, 1, \ldots N=1$) and $b_k$ ($k=0, 1, \ldots N$) can be written out explicitly for the largest anticipated order of N. The same formulae may be utilized when there are lower orders of N by setting $\beta_i = 0$ and $\omega_i = 0$ for the additional unused terms. The roots of the polynomial and matrix equation solution are found by standard conventional prior art techniques.

The filter frequency determining means 76 solves for the roots of Equation (7) or an equivalent precalculated equation for the number of terms previously selected to be accommodated. The gain determining means 78 solves Equation (8) or an equivalent equation for a different order of correction, to determine the $\alpha_i$ values. The settings of the digital calibration circuits 42 are set with the $\alpha_i$ and $\omega_i'$ values.

Once the calibration has been completed, the probe or search coil may be removed from the examination region and a patient or subject inserted therein. A central timing computer 80 controls the gradient field controller 30 and the radio frequency transmitter 20 to transmit conventional radio frequency and gradient field current pulse sequences to the transmission coil 22 and gradient field coils 34, respectively. Induced magnetic resonance signals are received by a radio frequency receiver 82. A Fourier transform means 84 transforms the received resonance signals into an image representation for storage in an image memory means 86. A display means 88 provides a manreadable display of the resultant image.

The invention has been described with reference to the preferred embodiment. Obviously, modifications and alterations will occur to others upon reading and understanding the preceding detailed description of the preferred embodiment. It is intended that the invention be construed as including all such alterations and modifications insofar as they come within the scope of the appended claims or the equivalents thereof.

Having thus described the preferred embodiment, the invention is now claimed to be:

1. A method of magnetic resonance calibration comprising:

disposing a pick-up coil in an examination region;
creating a magnetic field through the examination region;
applying a current pulse to a gradient field coil to induce creation of a first gradient of a preselected profile across the magnetic field, which first induced gradient induces a first voltage response in the pick-up coil, the first induced gradient having a profile differing from the preselected profile due to degradation by a plurality of eddy currents;
monitoring a voltage response induced in a pick up coil in the examination region by induced gradient;
analyzing the monitored voltage response to determine a first time constant of a first degrading eddy current and a first amplitude thereof;
determining first correction factors for the current pulse from the determined first eddy current time constant and amplitude;
altering the current pulse in accordance with the determined first correction factors and applying the altered current pulse to the gradient field coil to induce creation of a second gradient across the magnetic field, which second induced gradient induces a second voltage response in the pick-up coil, the induced second gradient having a second profile which differs from the preselected profile due to degradation by the eddy currents;
monitoring the second voltage response induced in the pick up coil by the second induced gradient;
analyzing the second monitored voltage response to determine a second time constant attributable to a second degrading eddy current and a second amplitude thereof;
determining second correction factors for the current pulse from the first and second time constants and amplitudes;
altering the current pulse in accordance with the second correction factors and applying the altered current pulse to the gradient field coil to induce a third gradient across the magnetic field having a third profile.

2. The method as set forth in claim 1 further including monitoring tho third gradient and determining a profile thereof and comparing the monitored third gradient profile with the preselected profile to determine conformity therebetween.

3. The method as set forth in claim 2 further including repeating the analyzing, correction factor determining, current pulse altering, current pulse applying, and monitoring steps until the preselected and monitored gradient profiles conform within preselected tolerances.

4. The method as set forth in claim 3 wherein in each repetition, the time constant determined by analyzing the monitored gradient profile is shorter than the time constant determined in the preceding repetition, whereby correction is made first for a gradient current with a longest time constant and successive corrections are made for successively shorter time constant eddy currents.

5. The method as set forth in claim 1 wherein the current pulse applying step includes applying current pulses to create two like gradient profiles with opposite polarity across the magnetic field and wherein the monitoring step includes monitoring the opposite polarity gradient profiles; and,
further including combining the opposite polarity gradient profiles to compensate for DC bias prior to performing the analyzing step.

6. The method as set forth in claim 1 further including between the monitoring and analyzing steps:
determining a profile of the monitored gradient;
sampling the profile at selectable intervals to acquire data for the analysis step.

7. The method as set forth in claim 6 further including adjusting the sampling intervals to adjust contributions from shorter time constant eddy currents.

8. A method of magnetic resonance calibration comprising:

creating a magnetic field through an examination region;
applying a current pulse to a gradient field coil to induce creation of a gradient of a preselected profile across the magnetic field, the induced gradient having a profile differing from the preselected profile due to degradation by a plurality of eddy currents;
monitoring a magnetic field response to the applied current pulse;
analyzing the monitored response to determine a first time constant of a first degrading eddy current and a first amplitude thereof;
determining corresponding first filter frequency and gain values from the determined first eddy current time constant and amplitude by:
solving a polynomial equation for the first filter frequency value; and,
performing a matrix inversion to solve for the gain value
corresponding to the first
filter frequency value;
altering the gradient field current in accordance with the determined first filter frequency and gain values and applying the altered current to the gradient field coil to induce creation of a second gradient across the magnetic field, the induced second gradient having a second profile which differs from the preselected profile due to degradation by the eddy currents;
monitoring a magnetic field response to the altered current pulse;
analyzing the monitored response to the altered current pulse to determine a second time constant attributable to a second degrading eddy current and a second amplitude thereof;
determining corresponding second filter frequency and gain values from the first and second eddy current time constants and amplitudes by:
solving a polynomial equation for the second filter frequency value; and,
performing a matrix inversion to solve for the gain value corresponding to the second filter frequency value;
further altering the current pulse in a accordance with the first and second filter frequency and gain values and applying the altered current pulse to the gradient field coil to induce a third gradient across the magnetic field.

9. A method of calibrating magnetic resonance imagers, the method comprising:
cyclically repeating the steps of:
applying current pulses to a gradient field coil to induce a magnetic field gradient;

integrating a signal induced in a pick up coil in response to the magnetic field gradient to provide a monitored gradient response profile;

comparing the monitored profile with a preselected profile;

analyzing the monitored profile to determine a time constant and amplitude attributable to a degrading eddy current; and, adjusting the current pulse profile in accordance with the determined time constant and amplitude;

until the monitored gradient profile substantially conforms to a preselected profile.

10. The method as set forth in claim 9 wherein in each repetition of the analysis step, the determined time constant is shorter than the preceding repetition.

11. A method of calibrating magnetic resonance imagers, the method comprising:
cyclically repeating the steps of:
applying current pulses to a gradient field coil to induce a magnetic field gradient;
monitoring a profile of the induced gradient magnetic field;
comparing the monitored profile with a preselected profile;
analyzing the monitored profile to determine a time constant and amplitude attributable to a degrading eddy current;
storing the time constant and amplitude from each repetition;
deriving a set of filter frequency and gain correction factors from the time constants and amplitudes;
adjusting the current pulse in accordance with the filter frequency and gain correction factors;
until the monitored gradient profile substantially conforms to the preselected profile.

12. The method as set forth in claim 11 wherein the filter frequency and gain factor deriving step further includes:
deriving the filter frequency correction factors from the stored time constants and amplitudes; and,
deriving the gain correction factors from the stored amplitudes, the derived filter frequency correction factors, and the stored time constants.

13. The method as set forth in claim 12 wherein:
the filter frequency correction factor determining step includes calculating the roots of a polynomial equation that describes a gradient response; and,
the gain correction factor determining step includes inverting a matrix that relates gain to eddy current amplitude to frequency.

14. A method of measuring, calibrating, and compensating for temporal response in magnetic resonance imagers, the method comprising:
cyclically repeating the steps of:
applying at least one current pulse to a gradient field coil with a gradient field means to induce a magnetic field gradient pulse;
monitoring the induced magnetic field gradient pulse over substantially a duration of the pulse to determine a monitored pulse profile;
comparing the monitored pulse profile with a preselected profile;
determining a compensation for a degrading eddy current from the comparing step; and,
calibrating the gradient field means in accordance with the determined compensation;
until the monitored pulse profile substantially conforms to the preselected pulse profile.

15. A magnetic resonance apparatus comprising:
means for creating a magnetic field through an examination region;
a gradient field means for generating current pulses with a preselected profile;
a compensation means for selectively altering each current pulse with selectable frequency and gain correction factors;
a gradient field coil means operatively connected with the compensation means for receiving the altered current pulse therefrom for generating a corresponding gradient across the main magnetic field;
monitoring means disposed in the examination region for monitoring an induced magnetic field gradient;
analyzing means for analyzing the monitored gradient to determine a time constant and amplitude corresponding to a degrading eddy current;
a frequency correction factor deriving means for deriving the frequency correction factors from the determined time constant and amplitude from the analyzing means, the frequency correction factor deriving means being operatively connected with the analyzing means and the current pulse compensation means; and,
a gain correction factor deriving means for deriving the gain correction factors from the determined time constants, the frequency correction factors, and the amplitudes, the gain correction factor deriving means being operatively connected with analyzing means and the correction pulse compensation means.

16. The apparatus as set forth in claim 15 further including a control means for controlling the gradient field means, to generate additional current pulses such that further induced gradient profiles are monitored and analyzed and the correction factors are further refined to bring the monitored gradient profile into greater conformity with a preselected profile.

17. The apparatus as set forth in claim 15 further including a time constant and amplitude memory means for storing a plurality of time constants and amplitudes, the time constant and amplitude memory means being operatively connected with the analyzing means to receive time constants therefrom and with the gain and frequency correction factors are derived from a plurality of time constants and a plurality of the amplitudes.

18. The apparatus as set forth in claim 15 further including:
a gradient profile means operatively connected with the monitoring means for determining a profile of the induced magnetic field gradient; and,
a comparing means operatively connected with the gradient profile means for comparing the induced gradient profile with the preselected profile.

19. The apparatus as set forth in claim 15 further including a DC bias correcting means for eliminating a DC bias from the monitored gradient profile.

20. The apparatus as set forth in claim 19 further including a storage means for storing the monitored gradient profile and a sampling means for intermittently sampling the stored gradient profile at selectable intervals.

21. The apparatus as set forth in claim 15 wherein the analyzing means measures a temporal response of the monitored gradient and compensates for temporal response of at least part of the gradient field means and the gradient field coil means.

22. A method of measuring and calibrating magnetic field gradients in magnetic resonance apparatus, the method comprising:
   inducing a magnetic field gradient pulse across a region of interest;
   sampling the induced magnetic field gradient a plurality of times during said gradient pulse;
   determining a time vs. gradient field amplitude gradient pulse profile from the samplings;
   comparing the pulse profile with a preselected profile;
   calibrating the gradient field means in accordance with the comparing step.

23. A method of measuring and calibrating a temporal response in a magnetic resonance apparatus, the method comprising:
   inducing a magnetic field gradient pulse having a pulse duration across a region of interest with a gradient field means;
   measuring a resultant magnetic field gradient a plurality of times over the pulse duration;
   from the plurality of measurements, determining an eddy current contribution to the resultant magnetic field gradient; and,
   calibrating the gradient field means in accordance with the determined eddy current contribution.

* * * * *